United States Patent [19]

Mori et al.

[11] 4,163,280
[45] Jul. 31, 1979

[54] ADDRESS MANAGEMENT SYSTEM

[75] Inventors: Ryuichi Mori, Tokyo; Tadao Ichikawa; Yukio Shiraogawa, both of Fuchu, all of Japan

[73] Assignee: Tokyo Shibaura Electric Co., Ltd., Japan

[21] Appl. No.: 807,500

[22] Filed: Jun. 17, 1977

[30] Foreign Application Priority Data

Jun. 30, 1976 [JP] Japan .................................. 51-76417

[51] Int. Cl.² .......................... G06F 3/00; G06F 5/00; G06F 9/20; G06F 13/00
[52] U.S. Cl. .................................................... 364/200
[58] Field of Search ... 364/200 MS File, 900 MS File

[56] References Cited

U.S. PATENT DOCUMENTS

| | | | |
|---|---|---|---|
| 3,693,165 | 9/1972 | Reiley et al. | 364/200 |
| 3,764,996 | 10/1973 | Ross | 364/200 |
| 3,854,126 | 12/1974 | Gray et al. | 364/200 |
| 3,893,084 | 7/1975 | Kotok et al. | 364/200 |
| 3,909,798 | 9/1975 | Wallach et al. | 364/200 |
| 3,976,976 | 8/1976 | Khosharian | 364/200 |
| 3,976,977 | 8/1976 | Porter et al. | 364/200 |
| 3,990,051 | 11/1976 | Shelly | 364/200 |
| 4,056,848 | 11/1977 | Gilley | 364/200 |
| 4,067,059 | 1/1978 | Derchak | 364/200 |

Primary Examiner—Gareth D. Shaw
Assistant Examiner—Michael C. Sachs
Attorney, Agent, or Firm—Finnegan, Henderson, Farabow & Garrett

[57] ABSTRACT

An address management system includes a central processing unit (CPU) and an address management unit arranged between a direct memory device (DMA) and a main memory unit to control memory access from the CPU and DMA. Segment registers for address expansion are provided in the CPU and DMA, respectively. The address management unit includes a conversion table for converting logical address data and segment data and segment data from the CPU and DMA into a corresponding physical address data, and the conversion table includes a bit position for detecting an address error and a control bit for selecting a memory access to a local memory or a shared memory.

20 Claims, 5 Drawing Figures 4,163,280

ADDRESS MANAGEMENT SYSTEM

BACKGROUND OF THE INVENTION

This invention relates to an address management system for use in computers and in particular an address management system having excellent system efficiency, which permits the conversion of logical address data to a physical address data as well as an address expansion and which can be handled only by the logical address data when considered from the standpoint of software.

A variety of address systems have recently been proposed with an increase in the memory capacity of memory devices. Generally, when one program only is utilized, there is less probability that a greater memory capacity is used. For the effective utilization of bits constituting a command word an access to the main memory is effected using a short-type address. One method is a base register system using a base register capable of representing the maximum capacity of a main memory in the form of an address. In this system a displacement data designated by a command word is added to an address data designated by the register to provide an address data for a main memory. Another method is an address paging system using a main memory divided into sequentially arranged blocks each considered as a page and a page register for holding the page data. The address position designated by a command word indicates an address position in a page unless otherwise specifically indicated, and a designation bit is provided in a command word to secure a linkage between each page and to perform an indirect address function.

The base register system requires an extra time for data entry into the base register. Since in an extreme case, for example, a save/restore operation needs to be repeated for each task switching, an overhead loss arises in an Operating System OS (a control program for making the use efficiency of a whole computer system maximal). The paging system is used generally in a minicomputer and a program size is restricted dependent upon how the pages should be set. If there is a program exceeding the capacity of the page, trouble results.

In a conventional computer a central processing unit CPU, direct memory access device DMA (for example, magnetic disc device or a magnetic tape device) and main memory unit are connected directly to each other or through memory buses. In either above-mentioned system an address preparation procedure is effected only at the CPU and a physical data is directly used in the DMA. That is, since a logical address data is used in program processing and a memory access from the DMA is carried out using physical address, a complicated address management is required in the preparation of an OS.

SUMMARY OF THE INVENTION

An object of this invention is to provide an address management system which permits access to a main memory to be gained not only from a central processing unit but also a direct memory access device by the use of a logical address, whereby an Operating System can be easily prepared with the enhanced efficiency of a computer operation.

Another object of this invention is to provide an address management system using an address management unit including a conversion table whereby a memory address space can be more extended than an actual memory capacity.

Another object of this invention is to provide an address management system using an address management unit including a conversion table in which selection control bits are provided for designating an access to any one of a local memory and shared memory, both constituting a main memory unit, to permit the shared memory to be easily incorporated into the main memory unit and in which an address error detection bit is provided for judging whether the content of the conversion table is correct or not and preventing a possible address designation error.

Another object of this invention is to provide an address management system having a central processing unit including at least two segment registers through which a rapid-speed and easy access of segment data is designated by the other segment register and is effected without avoiding or storing current segment data.

According to a broad aspect of this invention there is provided an address management system for use in a computer memory, comprising a main memory unit including a local memory and shared memory; a central processing unit for executing a program; direct memory access devices adapted to gain direct access to the main memory unit; an address management unit for converting logical address data to physical address data and controlling access of the central processing unit and direct memory access device to the main memory unit; and segment registers provided in the central processing unit and direct memory access device, respectively, and adapted to provide an address expansion of the main memory unit.

BRIEF DESCRIPTION OF THE PREFERRED EMBODIMENT

This invention will be further described by way of example with reference to the accompanying drawings in which.

DETAILED DESCRIPTION OF THE PREFERRED EMBODIMENT

Figure 1:
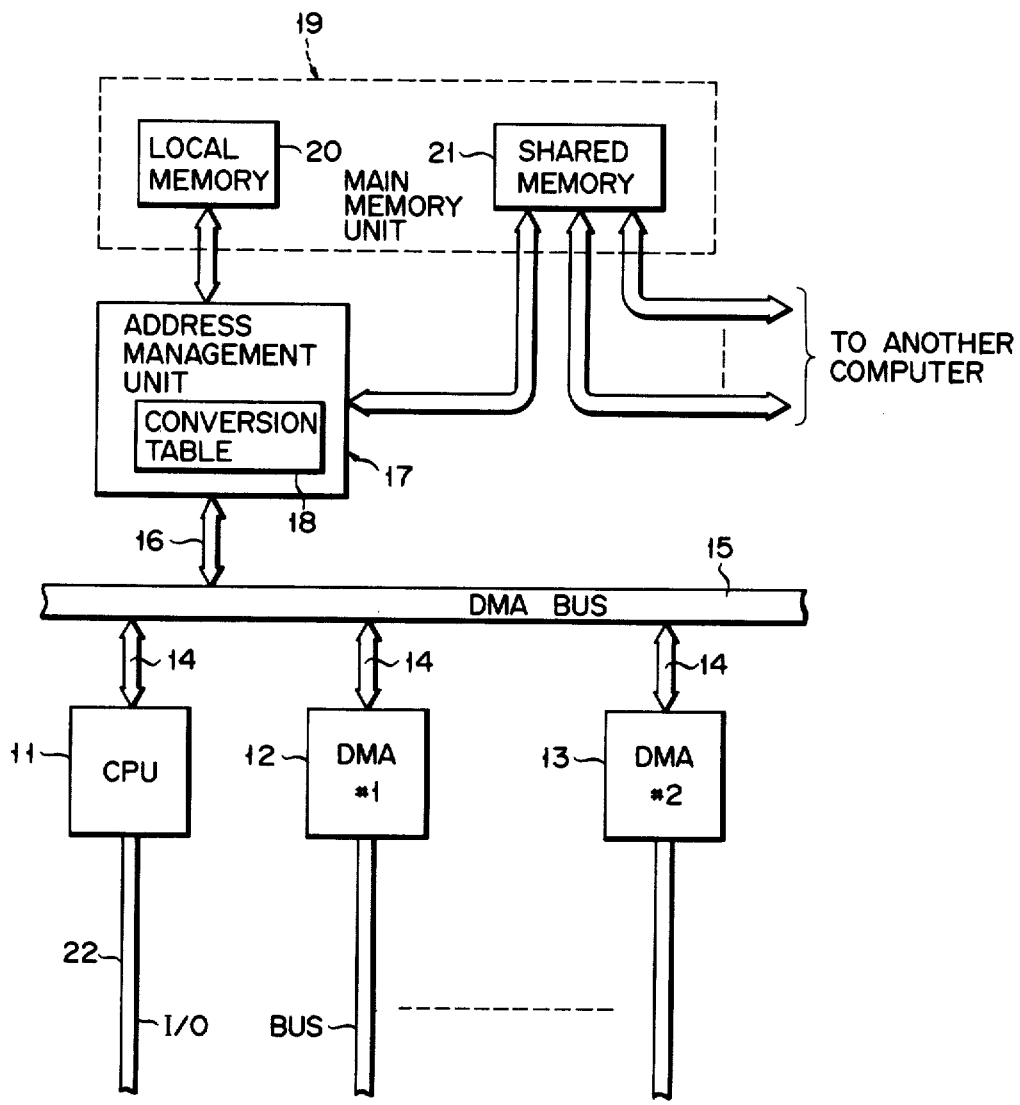
FIG. 1 is a schematic block diagram showing an address management system for use in a computer memory.

In FIG. 1 is shown an address management system according to the embodiment of this invention. A central processing unit (CPU) 11 and direct memory access (DMA) devices 12 and 13 are connected respectively through interface buses 14 to a DMA bus 15. An address management unit 17 is connected through an interface bus 16 to the DMA bus 15 and effects a control when CPU 11 and DMA devices 12 and 13 gain access to a memory. The unit 17 includes a conversion table 18 for conversion from a logical address data to a physical address data and is connected through a bus to a main memory unit 19. The main memory unit 19 comprises a local memory 20 exclusively used by one computer and a memory 21 shared by another computer. Main memory unit 19 is a memory unit accessible by an address designation. CPU 11 is connected to an input/output buss 22 for having access to the main memory through CPU 11. CPU 11 has the function of executing an instruction for processing data, for example, subtract data, add data, etc., which is stored in the main memory unit 19. An input/output device connected to the input/output bus 22 is generally at low speed in comparison with the access speed of the DMA device. DMA 12 has the function of effecting a direct data transfer with respect to the main memory unit 19 and comprises, for example, a magnetic disc or magnetic drum.

When access is given to the main memory unit 19 from CPU 11 and DMA devices 12 and 13, a device having a priority for using the DMA bus 15 delivers address data to the DMA bus 15. The priority is given, by a bus controller, to the DMA bus 15. A logical address data through the DMA bus 15 is converted by the address management unit 17 to a physical address data through the bus 16. The address management unit 17 is adapted to control access of the DMA device to the main memory unit 19. This control as will be described later includes a control of whether to gain access to the local memory 20 in the main memory unit or to the shared memory, a check as to whether address data converted at the conversion table 18 is correct or not, an interruption timing control and so on.

Figure 2:
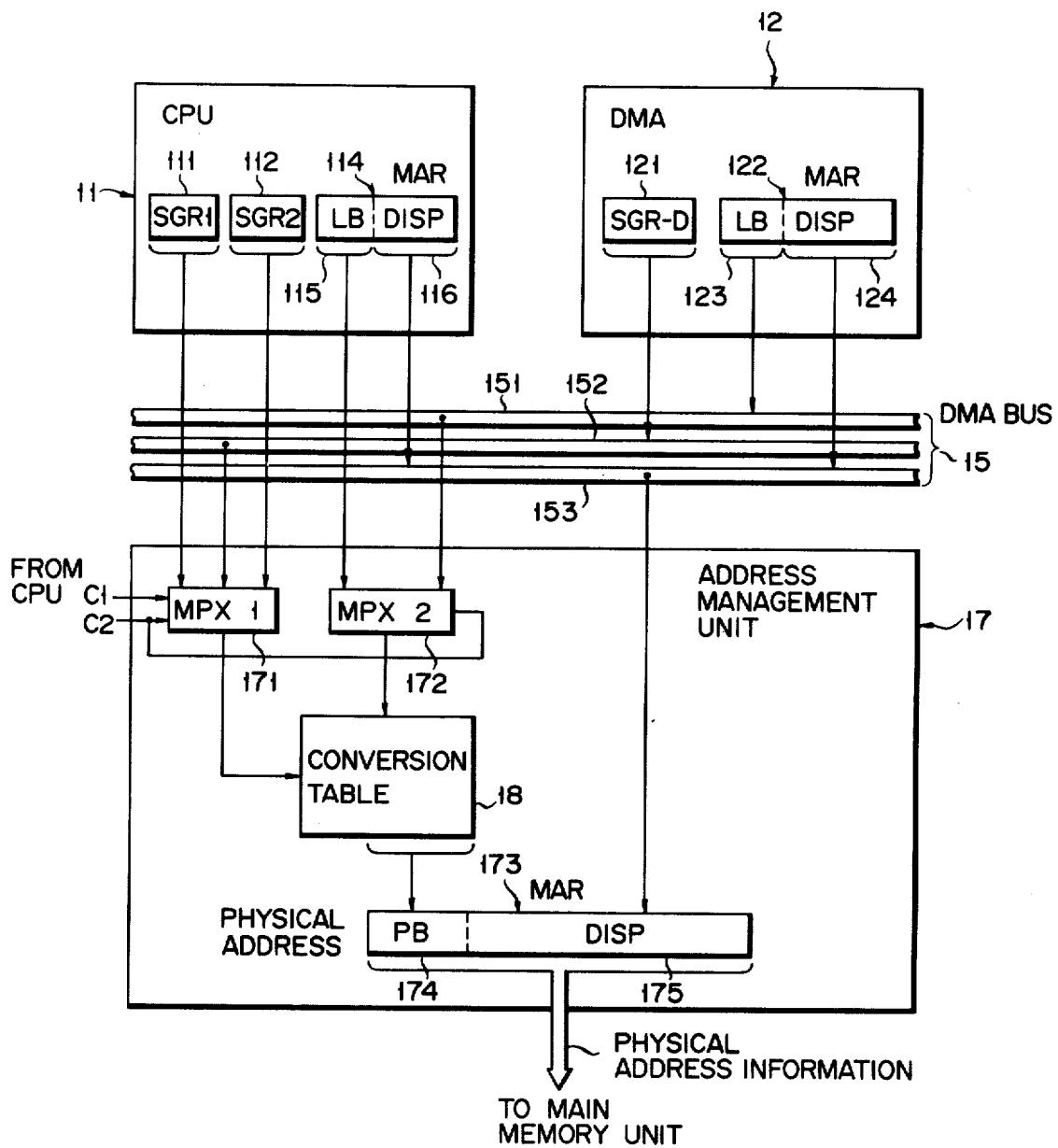
FIG. 2 is a detailed view showing a major part of the system in FIG. 1, i.e., a central processing unit, direct memory access devices and address management unit.

FIG. 2 shows a major part of the address management system shown in FIG. 1. In this Figure, similar reference numerals are employed to designate similar elements or parts.

CPU 11 includes a segment register (SGR1) 111 for permitting entry of segment data when usually access is gained to the main memory unit, 19, a segment register (SGR2) 112 for permitting entry of segment data upon receipt of a predetermined timing signal, and a memory address register MAR 114 for permitting replacement of logical address data. The segment register 111 is used for instruction fetch, and the segment register 112 for operand fetch. A logical block data (LB) 115 and displacement data 116 are stored in the register MAR 114. The displacement data DISP is a data for designating an address displacement position in each segment block memory.

The DMA bus 15 includes a bus 151 for transferring a logical block data (LB) 123 from the DMA device 12 to the address management unit 17, a bus 152 for transferring a segment data from a segment register (SGR-D) 121 in the DMA device to the address management unit 17, and a bus 153 for transferring the displacement data DISP 116 and 124 of MARs 114 and 122, respectively, from CPU 11 to the address management unit 17. The priority use of the DMA bus 15 is controlled by a bus controller not shown and a device to which a priority for using the buses 151 to 153 is given is always one DMA and one CPU. The technique is shown in the bus controller.

The address management unit 17 includes a change over circuit (MPX1) 171 for selectively switching segment data from the segment registers (SGR1, SGR2) 111, 112 in the CPU 11 and the segment register (SGR-D) 121 in the DMA device 12, a change-over circuit (MPX2) 172 for effecting selective change-over between a logical block data (LB) 115 stored in MAR 114 in CPU 11 and a logical block data (LB) 123 stored in MAR 122 in DMA 12, a conversion table 18 in which predetermined physical address data corresponding to the logical address data are stored for conversion from the logical address data to the physical address data, and a memory address register (MAR) 173 for storing the physical address data. The change-over circuits 171 and 172 can be readily constructed by conventional techniques using multiplexer circuits. The conversion circuit (MPX1) 171 is controlled by control signals C1 and C2 of CPU 11 so as to select a predetermined segment data. The control signal C1 is for effecting a changeover between CPU 11 and DMA device 12, while the control signal C2 is for effecting a changeover between the segment register (SGR1) 111 and segment register (SGR2) 112 in CPU 11. The change-over circuit (MPX2) 172 is adapted to effect, upon receipt of the control signal C1, a changeover between LB123 in DMA12 and LB115 in CPU 11. Since the predetermined physical address data corresponding to the logical address data are stored in the conversion table 18, the logical address data through the change-over circuits 171 and 172 are coupled to the conversion table 18 to produce a corresponding physical block data. The physical block data of the conversion table 18 is stored in a physical block data PB section 174 in the memory address register MAR 173, and the displacement data DISP 116 in CPU 11 and displacement data DISP 124 in DMA device 12 lead to the bus 153. The control of whether a priority is given to CPU 11 or DMA 12 is effected by the above-mentioned bus controller. In consequence, any one of these displacement data is connected through the bus 153 to a displacement data section DISP 175 in the memory address register MAR 173 of the address management unit 17 where it is stored. That is, the memory address register 173 is represented by the physical block data PB 174 from the conversion table 18 and the displacement data DISP on the logical address in DMA 12. Since the displacement data DISP shows the displacement position in one block, it undergoes no change whether the logical block data or the physical block data is involved.

Figure 3:
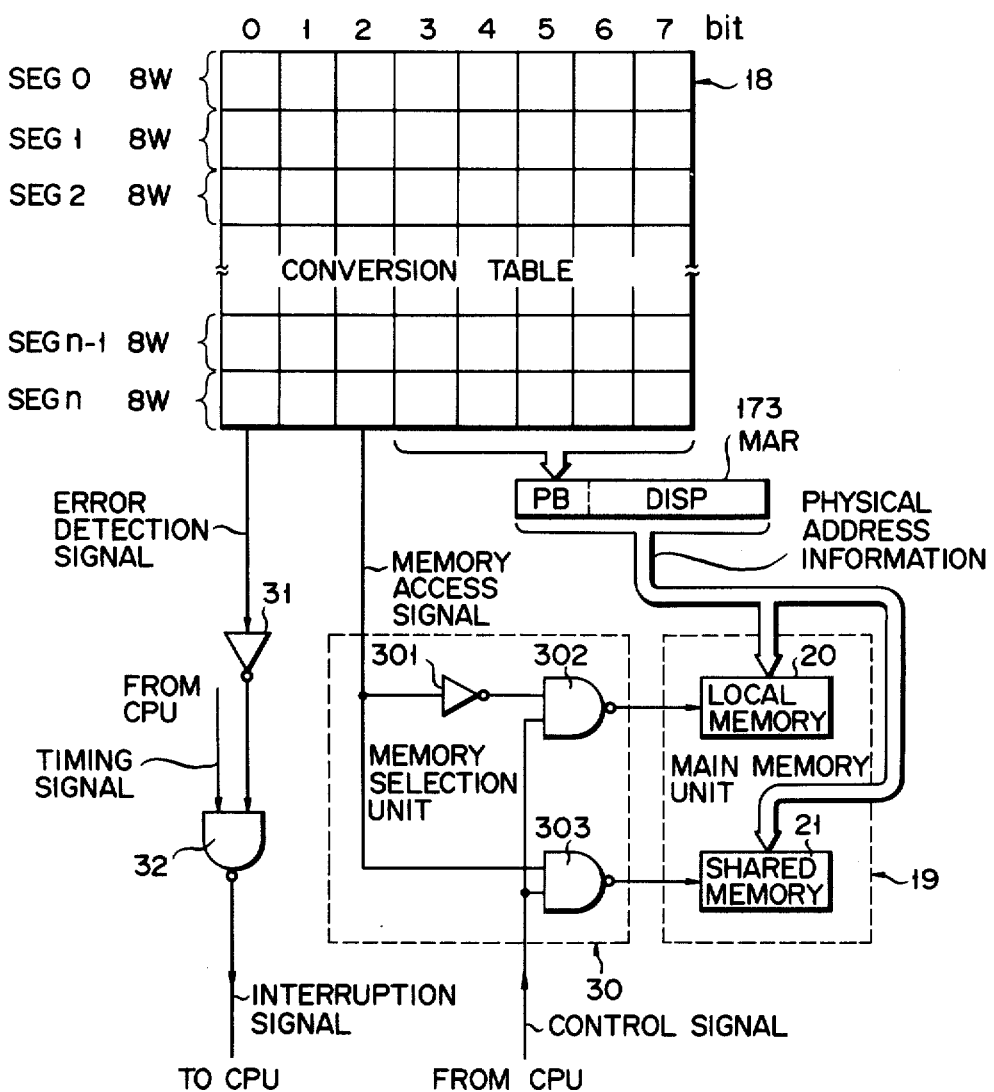
FIG. 3 is a detailed view showing a conversion table in FIG. 2 and a control circuit in the periphery of the conversion table.

FIG. 3 shows a detail of the conversion table 18 in FIG. 2 and memory access control circuit. The conversion table 18 is comprised of a plurality of segments SEG0, SEG1 . . . . SEGn, each of which consists of, for example, 8 words × 8 bits. In this embodiment, for example, out of each word in the conversion table 18,0 to 2 significant bits are used as control bits and 3 to 7 significant bits as address data bits. That is, the 0 significant bit is used to detect whether an address data converted in the conversion table 18 is in error or not, and the 2 significant bit is to gain access to the local memory 20 and shared memory 21. A memory selection unit 30 is adapted to select either one of the local memory 20 and shared memory 21 upon receipt of a memory access signal of 2 significant bit. The memory selection unit 30 includes an inverter 301 for inverting a memory access signal, a first NAND gate 302 for designating an access to the local memory 20 by NANDing the output of the inverter 301 and the control signal of CPU 11, and a second NAND gate 303 for designating an access to the shared memory 21 by NANDing the memory access signal and a control signal generated from CPU 11 in the execution of a memory access. An address error detection signal of 0 significant bit is connected through an inverter 31 to one input terminal of a NAND gate 32. The output signal of the inverter 31 and a timing signal from CPU 11 are NANDed at the NAND gate 32 to generate an interruption signal for informing CPU 11 of an address error. A physical address data on MAR 173 is conducted to the local memory 20 and shared memory 21 so as to designate an address where the memory access is designated.

The operation of the address management system according to this invention will be explained by referring to FIGS. 1 through 3.

Now suppose that segment data is stored in the segment registers 111 and 112 in CPU 11 and the segment register 121 in DMA 12 and that logical data is stored in MAR 114 in CPU 11 and MAR 122 in DMA 12.

(a) Where CPU 11 has access to the main memory unit 19, the memory access is controlled by a program. The segment data of the segment registers (SGR1) 111 and (SGR2) 112 are fed directly to the change-over circuit 171. At this time, a "1" level control signal C1 and "1" level control signal C2 are applied to the change-over circuit 171, and the "1" level control signal to the change-over circuit 172.

Out of three segment data, the segment data on the segment register (SGR1) 111 is selected in the change-over circuit 171 for delivery to the conversion table 18. The change-over circuit 172 selects the logical block data on MAR 114 in CPU 11 for delivery to the conversion table 18. In the address management unit 17 a table look-up is done at the conversion table 18 based on the segment data of the segment register (SGR1) 111 in CPU 11 and logical block data LB of MAR 114 in CPU 11 so as to effect conversion to a physical block data PB. The physical block data PB is stored in MAR 173 and fed, together with the displacement data passed through the bus 153 from CPU 11, to main memory unit 19 as a physical address. When the 2 significant bit of the conversion table 18 is at a "0" level, the NAND gate 302 delivers a "1" output signal upon receipt of a control signal from CPU 11 and the memory selection unit 30 selects the shared memory 21. As a result, a memory access to an address in the shared memory 21 as designated by MAR 173 is executed, permitting execution of an instruction fetch.

The above-mentioned control signal C2 becomes a logical "0" level after a predetermined time period and a segment data on the segment register (SGR2) 112 is fed to the conversion table 18. In the same procedure a memory access to the shared memory 21 is done and an operand fetch is executed.

If an address data converted at the conversion table 18 is in error, the NAND gate 32 receives an address error detection signal and timing signal to generate an interruption signal for delivery to CPU 11.

(b) Where DMA 12 gains access to the main memory unit 19, control is shifted from CPU 11 to DMA 12. In this case, the control signals C1 and C2 are both at the "0" level and the change-over circuit 171 delivers the segment data on the segment register (SGR-D) 121 in DMA 12 to the conversion table 18. The change-over circuit 172 delivers the logical block data LB on MAR 122 in DMA 12 to the conversion table 18. In the same procedure as mentioned in the section (a) access is gained to the main memory unit 11. If the 2 significant bit in the conversion table 18 is at a logical "1" level, the NAND gate 303 produces a "1" level output to permit the shared memory 21 to be selected. An error in address data is controlled in the same manner as described in example (a).

Figure 4:
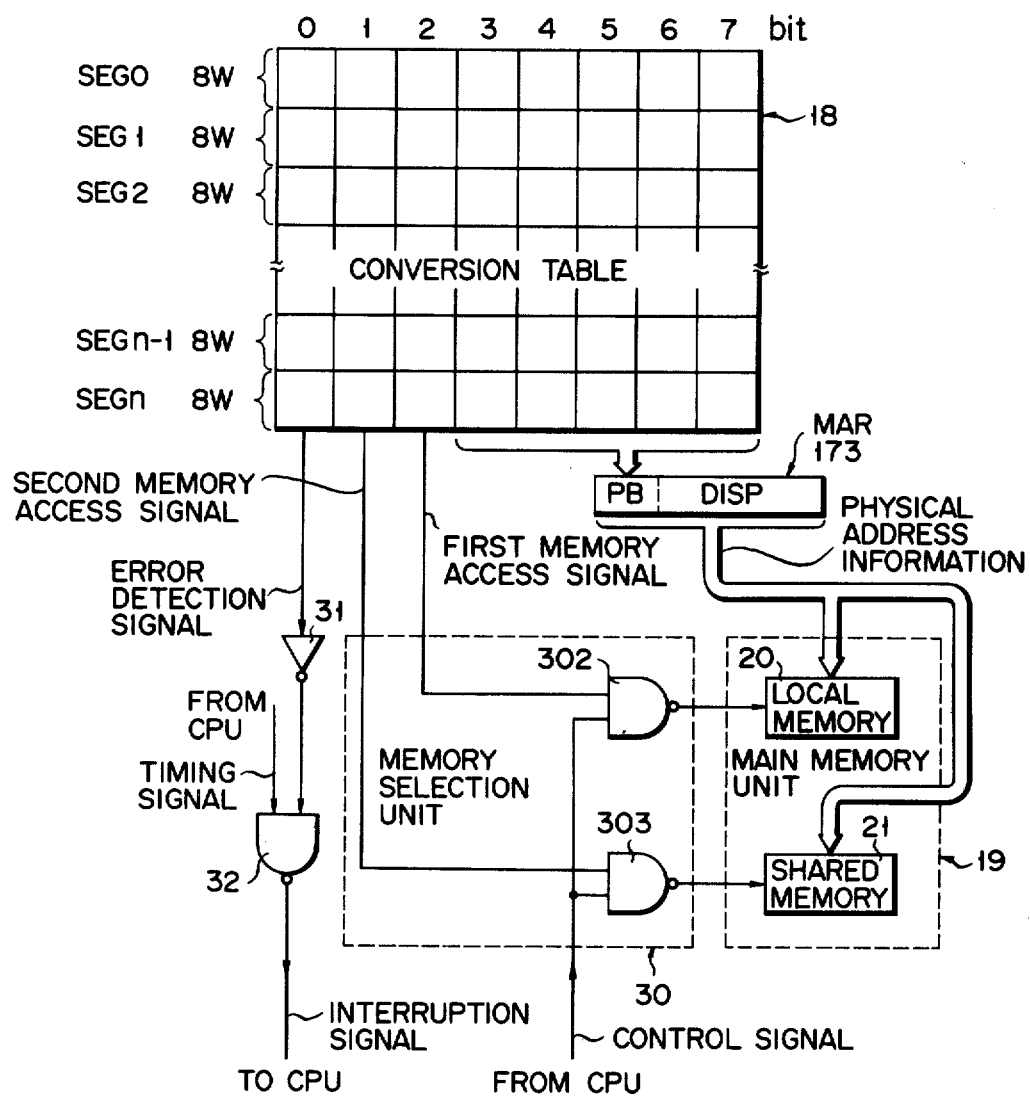
FIG. 4 is a modification of the circuit in FIG. 3.

The circuit in FIG. 3 can be modified as shown in FIG. 4. In the circuit shown in FIG. 4 the 2 significant bit in the conversion table 18 is used as a control bit for having access to the local memory 20, and the 1 significant bit as a control bit for having access to the shared memory 21. Therefore, the memory selection unit 30 includes a first NAND gate 302 for NANDing a first memory access signal and a control signal from CPU 11, and a second NAND gate 303 for NANDing a second memory access signal and the control signal from CPU 11. The circuit in FIG. 4 performs the same operation as mentioned in connection with FIG. 3.

Figure 5:
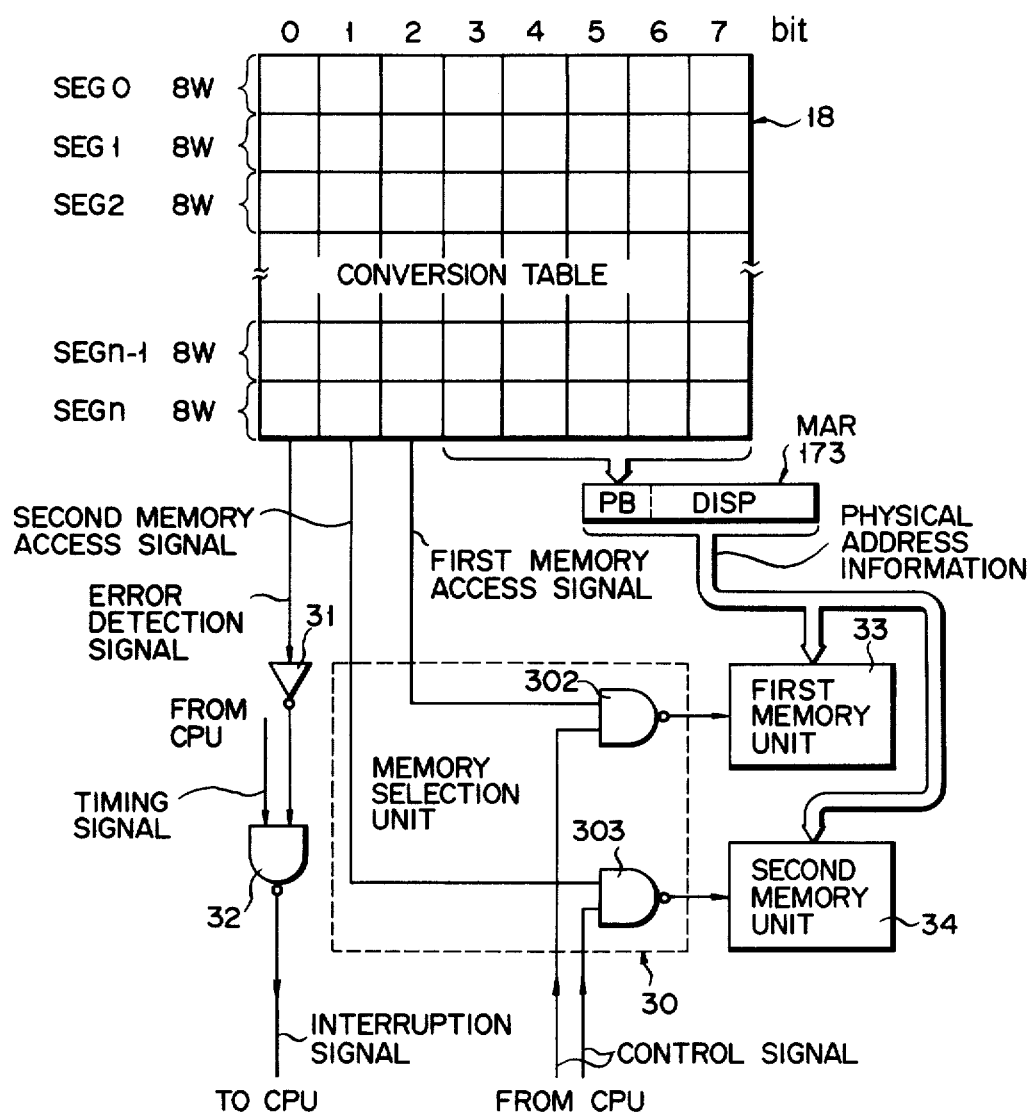
FIG. 5 is an application circuit of the circuit in FIG. 4.

FIG. 5 is an application of the circuit in FIG. 4. In this circuit, first and second memory units are independently provided instead of the main memory unit 19. The first memory unit 33 corresponds to the 2 significant bit in the conversion table 18, and the second memory unit 34 to the 1 significant bit in the conversion table 18.

In the memory selection unit 30 the first NAND gate 302 receives a 2 significant bit data and the second NAND gate 303 receives a 1 significant bit data. Control signals inputted into the first and second NAND gates 302 and 303 from CPU 11 are different from each other. That is, the control signal to the first NAND gate 302 generates a level "1" signal when the second memory unit is down or has produced a parity error, and the control signal to the second NAND gate 303 generates a level "1" signal when the first memory unit is down or has produced a parity error. These control signals can be generated easily by known CPU techniques. Even if either one of the first and second memory units 33 and 34 is at fault or down, a switching to the other memory unit can be effected. permitting the backup of the memory unit with consequent improved system efficiency.

What we claim is:

1. In a data processing system comprising a main memory unit including a local and shared memory, a central processing unit for executing a program including a first register having first logical addresses and segment registers comprising segment block data for address expansion, and direct memory access devices adapted to gain direct access to the main memory unit each including a second register having second logical addresses and a segment register comprising segment block data for address expansion, an address management unit for controlling access to either the local or shared memory by the central processing unit or direct memory access devices comprising a conversion table for converting logical addresses selectively received from the segment registers and first and second registers of the central processing unit and direct memory access devices into physical addresses for accessing the main memory unit.

2. A data processing system according to claim 1, in which said address management unit includes a conversion table of predetermined bit configuration adapted to convert logical address data sent thereto from the central processing unit and direct memory access device to physical address data for designating the local and shared memories.

3. A data processing system according to claim 2, in which said conversion table includes a predetermined bit for designating an access to the local memory or the shared memory.

4. A data processing system according to claim 2, in which said conversion table includes a predetermined bit for designating an access to the local memory.

5. A data processing system according to claim 2, in which said conversion table includes a predetermined bit for designating the shared memory.

6. A data processing system according to claim 2, in which said conversion table includes a first predetermined bit for designating an access to the local memory or the shared memory, and a second predetermined bit for detecting an address error delivered from the conversion table.

7. A data processing system according to claim 2, in which said conversion table includes a first predetermined bit for designating an access to the local memory and a second predetermined bit for detecting an address error delivered from the conversion table.

8. An address management system according to claim 2, in which said conversion table includes a first predetermined bit for designating an access to the shared memory and a second predetermined bit for detecting an address error delivered from the conversion table.

9. An address management system according to claim 2, in which said conversion table includes a first predetermined bit for designating an access to the local memory, a second predetermined bit for designating an access to the shared memory and a third predetermined bit for detecting an address error delivered from the conversion table.

10. An address management system according to claim 1, in which said central processing unit includes at least two segment registers so as to effect an address expansion.

11. An address management system according to claim 10, in which one of the two segment registers is used for instruction fetch and the other is used in a predetermined timing for operand fetch.

12. An address management system according to claim 10, in which at least one of the two segment registers is used for instruction fetch.

13. An address management system according to claim 10, in which at least one of the two segment registers is used for operand fetch.

14. A data processing system according to claim 1, in which said address management unit includes interruption means adapted to, when an address error is detected at a first predetermined bit position of a conversion table for converting the logical address data to physical address data, send an interruption signal to the central processing unit when a first predetermined bit data appears at the first bit position of the conversion table, and memory selection means for selecting either one of the local memory and shared memory when a second predetermined bit data is delivered at the second bit position of the conversion table.

15. A data processing system according to claim 14, in which said interruption includes an inverter for inverting the first predetermined bit data, and a NAND gate for NANDing an output of the inverter and a timing signal from the central processing unit.

16. A data processing system according to claim 14, in which said memory selection means includes an inverter for inverting the second predetermined bit data, a first NAND gate for designating an access to the local memory by NANDing the output of the inverter and a control signal from the central processing unit, and a second NAND gate for designating an access to the shared memory by NANDing the second predetermined bit data and a control signal from the central processing unit.

17. A data processing system according to claim 14, in which said memory selection means includes a first NAND gate for designating an access to the local memory by NANDing a first predetermined bit data from the conversion table and a control signal from the central processing unit, and a second NAND gate for designating an access to the shared memory by NANDing a second predetermined bit data from the conversion table and the control signal from the central processing unit.

18. A data processing system for use in a computer memory, comprising a central processing unit including a first segment register used for instruction fetch and adapted to store a first segment data, a second segment register used for operand fetch and adapted to store a second segment data and a first memory address register for storing a first logical block data and a first displacement data; a direct memory access device including a third segment register for storing a third segment data and a second memory address register for storing a second logical block data and a second displacement data; and an address management system comprising an address management unit including a first change-over circuit for selecting any one of the first, second and third segment data, a second change-over circuit for selecting any one of the first and second logical block data, a conversion table for converting a segment data from the first change-over circuit and a logical block data from the second change-over circuit to a corresponding physical block data, and a third address register for storing a physical block data from the conversion table and any one of the first and second displacement data so as to represent an actual physical memory address.

19. A data processing system for use in a computer memory, comprising a main memory unit including a local memory and a shared memory; a central processing unit for effecting a data transfer to and from the main memory unit so as to execute a program; direct memory access devices adapted to gain direct access to the main memory unit; a conversion table of word bit configuration adapted to convert logical address data designated from the central processing unit and direct memory access device into a corresponding physical address data and including a first predetermined bit for detecting an address error and a second predetermined bit for gaining access to the main memory unit; means adapted to, when an address error is detected, send an interruption signal to the central processing unit and including an inverter for inverting the first predetermined bit data and a NAND gate for NANDing the output of the inverter and a timing signal from the central processing unit; and means adapted to select an access to the local memory or the shared memory and including an inverter for inverting the second predetermined bit data, a first NAND gate for NANDing the output of the inverter and a control signal from the central processing unit and a second NAND gate for NANDing the second predetermined bit data and the control signal for the central processing unit.

20. A data processing system for use in a computer memory, comprising memory means including first and second memory units; a central processing unit for effecting a data transfer to and from the memory so as to execute a program; a conversion table of word bit configuration adapted to convert logical address data designated from the central processing unit and direct memory access device into a corresponding physical address and including a first predetermined bit for detecting an address error, a second predetermined bit for gaining access to the first memory unit and a third predetermined bit for having access to the memory unit; means adapted to send an interruption signal to the central processing unit and including an inverter for inverting the first predetermined bit data and a NAND gate for NANDing the output of the inverter and a timing signal from the central processing unit; and means adapted to select an access to the first memory unit or the second memory unit and including a first NAND gate for NANDing a third predetermined bit data and a control signal from the central processing unit which is generated when the second memory unit is down and a second NAND gate for NANDing a second predetermined bit data and a control signal from the central processing unit which is generated when the first memory unit is down.

* * * * *

UNITED STATES PATENT AND TRADEMARK OFFICE
CERTIFICATE OF CORRECTION

PATENT NO. : 4,163,280
DATED : July 31, 1979
INVENTOR(S) : RYUICHI MORI ET AL

It is certified that error appears in the above-identified patent and that said Letters Patent are hereby corrected as shown below:

IN THE CLAIMS:

In Claim 8, "An address management" should read -- A data processing --;

In Claim 9, "An address management" should read -- A data processing --;

In Claim 10, "An address management" should read -- A data processing --;

In Claim 11, "An address management" should read -- A data processing --;

In Claim 12, "An address management" should read -- A data processing --;

UNITED STATES PATENT AND TRADEMARK OFFICE
CERTIFICATE OF CORRECTION

PATENT NO. : 4,163,280

DATED : July 31, 1979

INVENTOR(S) : RYUICHI MORI ET AL

It is certified that error appears in the above—identified patent and that said Letters Patent is hereby corrected as shown below:

In Claim 13, "An address management" should read

-- A data processing --.

[SEAL]

Signed and Sealed this

Eleventh Day of December 1979

Attest:

SIDNEY A. DIAMOND

Attesting Officer

Commissioner of Patents and Trademarks